United States Patent
Jeon (10) Patent No.: US 10,044,260 B2
(45) Date of Patent: Aug. 7, 2018

(54) CHARGE PUMP CIRCUIT AND VOLTAGE GENERATING DEVICE INCLUDING THE SAME

(71) Applicant: Sk hynix Inc., Gyeonggi-do (KR)

(72) Inventor: Chung-Hun Jeon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/665,493

(22) Filed: Aug. 1, 2017

(65) Prior Publication Data

US 2018/0183328 A1 Jun. 28, 2018

(30) Foreign Application Priority Data

Dec. 27, 2016 (KR) .................. 10-2016-0180377

(51) Int. Cl.
*H02M 3/07* (2006.01)
*G05F 3/20* (2006.01)
*G11C 5/14* (2006.01)
*H03K 17/06* (2006.01)

(52) U.S. Cl.
CPC ............ *H02M 3/073* (2013.01); *G05F 3/205* (2013.01); *G11C 5/146* (2013.01); *H03K 17/063* (2013.01); *H03K 2217/0018* (2013.01)

(58) Field of Classification Search
CPC combination set(s) only.
See application file for complete search history.

(56) References Cited

U.S. PATENT DOCUMENTS 5,805,509 A * 9/1998 Leung ................ G11O 5/146
327/534
6,404,270 B1 * 6/2002 Meng ................ H02M 3/073
327/534

FOREIGN PATENT DOCUMENTS

KR 1020070102232 10/2007

* cited by examiner

*Primary Examiner* — An Luu
(74) *Attorney, Agent, or Firm* — IP & T Group LLP (57) ABSTRACT

A charge pump circuit may include: input units suitable for receiving a first input pulse signals and outputting second input pulse signals that are out of phase; an internal voltage generation unit suitable for generating an internal voltage by performing a voltage pumping operation in response to an external voltage and the second input pulse signals, and adjusting a well bias voltage at a power-up period and a normal operation period after the power-up period, in response to a switching control signal; and a switching control signal generation unit suitable for generating the switching control signal which is activated differently on the power-up period and the normal operation period.

20 Claims, 8 Drawing Sheets

CHARGE PUMP CIRCUIT AND VOLTAGE GENERATING DEVICE INCLUDING THE SAME

CROSS-REFERENCE TO RELATED APPLICATIONS

The present application claims priority of Korean Patent Application No. 10-2016-0180377 filed on Dec. 27, 2016, which is incorporated herein by reference in its entirety.

BACKGROUND

1. Field

This patent document relates to a semiconductor design technology and, more particularly, to a charge pump circuit capable of generating an internal voltage by pumping an external voltage, and a voltage generating device including the same.

2. Description of the Related Art

As the critical dimensions of a semiconductor process gradually shrink, an external voltage used in a semiconductor device is also reduced gradually. The use of a low external voltage is required for low-power semiconductor devices driven by batteries and is an important design factor for improving the reliability of fine processes. However, typically, not all internal circuits of the semiconductor devices are operated by the external voltage. Some circuits may require a high voltage for operation. For this reason, typically, semiconductor devices require a circuit which can receive the external voltage and generate a high internal voltage from the external voltage. An example of such circuit is a charge pump circuit.

Currently, it is common that a semiconductor device may receive various types of external voltages having different levels, for operation. The external voltages used in the semiconductor device are inputted to the semiconductor device through a voltage pad installed in the semiconductor device, and transmitted to various circuits of the semiconductor device through a line coupled to the voltage pad. The charge pump circuit may generate an internal voltage using a main supply voltage VDD (for example, an active level of 1.2V) and a high supply voltage VPPEXT (for example, an active level of 2.5V), among the voltages inputted to the semiconductor device.

The supply voltages VDD and VPPEXT supplied from outside the semiconductor device through the voltage pad rise to the active levels from a predetermined level (for example, ground voltage) with a constant slope. Since the voltage of an internal node in the charge pump circuit has a random level while no power is supplied to the semiconductor device, leakage current may occur in the charge pump circuit when the supply voltages VDD and VPPEXT rise. When an excessive amount of leakage current occurs in the semiconductor device, an error such as a booting fail may occur in the semiconductor device.

SUMMARY

Various embodiments are directed to a charge pump circuit capable of increasing drivability and a voltage generating device including the same.

In an embodiment, a charge pump circuit may include: input units suitable for receiving a first input pulse signals and outputting second input pulse signals that are out of phase; an internal voltage generation unit suitable for generating an internal voltage by performing a voltage pumping operation in response to an external voltage and the second input pulse signals, and adjusting a well bias voltage at a power-up period and a normal operation period after the power-up period, in response to a switching control signal; and a switching control signal generation unit suitable for generating the switching control signal which is activated differently on the power-up period and the normal operation period.

The switching control signal generation unit may generate the switching control signal in response to a power-up signal and a pumping enable signal.

The internal voltage generation unit may include a transfer transistor unit suitable for applying the internal voltage as the well bias voltage or applying a voltage obtained by subtracting a threshold voltage from the internal voltage as the ell bias voltage, in response to the switching control signal.

During the power-up period, the transfer transistor unit may apply the internal voltage as the well bias voltage in response to the switching control signal activated to a high level.

During the normal operation period, the transfer transistor unit may apply the voltage obtained by subtracting the threshold voltage from the internal voltage as the well bias voltage, in response to the switching control signal deactivated to a low level.

The transfer transistor unit may include: a first PMOS transistor coupled between a generation node and a first node, the first PMOS transistor having a gate terminal coupled to a second node and a bulk terminal configured to receive the well bias voltage; a second PMOS transistor coupled between the generation node and the second node, the second PMOS transistor having a gate terminal coupled to the first node and a bulk terminal configured to receive the well bias voltage; a third PMOS transistor coupled between the generation node and the well bias voltage node, the third PMOS transistor having a gate terminal configured to receive the well bias voltage; a first switch having a first end coupled to the bulk terminal of the first PMOS transistor and a second end coupled to the generation node or a drain terminal of the third PMOS transistor in response to the switching control signal; and a second switch having a first end coupled to the bulk terminal of the second PMOS transistor and a second end coupled to the generation node or the drain terminal of the third PMOS transistor in response to the switching control signal.

During the power-up operation period the external voltage may have a higher voltage level than the internal voltage.

During the normal operation period the internal voltage may reach a target level higher than the external voltage after the power-up period.

The internal voltage generation unit may include: first capacitive element coupled between the first node and a third node; a second capacitive element coupled between the second node and a fourth node; a first NMOS transistor having a first terminal coupled to the first node, a second terminal configured to receive the external voltage, a gate terminal coupled to the second node, and a bulk terminal coupled to the fourth node; a second NMOS transistor having a first terminal coupled to the second node, a second terminal configured to receive the external voltage, a gate terminal coupled to the first node, and a bulk terminal coupled to the third node; a third NMOS transistor having a first terminal coupled to the second node, a second terminal and a gate terminal configured to receive the external voltage, and a bulk terminal coupled to the third node; and a fourth NMOS transistor having a first terminal coupled to the first node, a second terminal and a gate terminal configured to receive the external voltage, and a bulk terminal coupled to the fourth node.

Each of the first and second capacitive elements may include a capacitor.

The first and second NMOS transistors may precharge the first and second nodes to the external voltage in response to the signal levels of the third and fourth nodes.

The external voltage may include a high voltage having a higher voltage level than a main supply voltage VDD.

In an embodiment, an operation method of a charge pump circuit may include: receiving an input pulse signal; generating a switching control signal; and generating an internal voltage by performing a pumping operation in response to the input pulse signal and an external voltage, wherein the internal voltage is applied as a well bias voltage during a power-up operation, and a voltage obtained by subtracting a threshold voltage from the internal voltage is applied as the well bias voltage during a normal operation after the power-up operation, in response to the switching control signal.

The generating of the switching control signal may include: generating the switching control signal at a high level during the power-up operation in response to a power-up signal and a pumping enable signal; and generating the switching control signal at a low level during the normal operation after the power-up operation in response to the power-up signal and the pumping enable signal.

The power-up operation period may be where the external voltage has a higher voltage level than the internal voltage.

The normal operation period may be where the internal voltage reaches a target level higher than the external voltage, after the power-up period.

In an embodiment, a voltage generating device may include: a sensing unit suitable for generating a sensing signal based on a reference voltage and an internal voltage; an oscillator suitable for generating a first input pulse signal in response to the sensing signal; and a charge pump unit suitable for generating an internal voltage by performing a pumping operation in response to the input pump signal and an external voltage, and applying the internal voltage as a well bias voltage during a power-up period or applying a voltage obtained by subtracting a threshold voltage from the internal voltage as the well bias voltage during a normal operation period after the power-up period.

The charge pump unit may include: input units suitable for receiving the first input pulse signal and outputting second input pulse signals that are out of phases each other; an internal voltage generation unit suitable for generating the internal voltage by performing a voltage pumping operation in response to an external voltage and the second input pulse signals, and adjusting the well bias voltage at the power-up period and the normal operation period, in response to a switching control signal; and a switching control signal generation unit suitable for generating the switching control signal of which activation is differently controlled depending on the power-up period and the normal operation period.

The internal voltage generation unit may include a transfer transistor unit suitable for applying the internal voltage as the well bias voltage or applying the voltage obtained by subtracting the threshold voltage from the internal voltage as the well bias voltage, in response to the switching control signal.

During the normal operation period the internal voltage may reach a target level after the power-up period.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

In the following description, numerous specific details are set forth in order to provide a thorough understanding of the present invention. The present invention may be practiced without some or ail of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another, unless specifically indicated otherwise.

Hereinafter, the various embodiments of the present invention will be described in detail with reference to the attached drawings.

Figure 1:
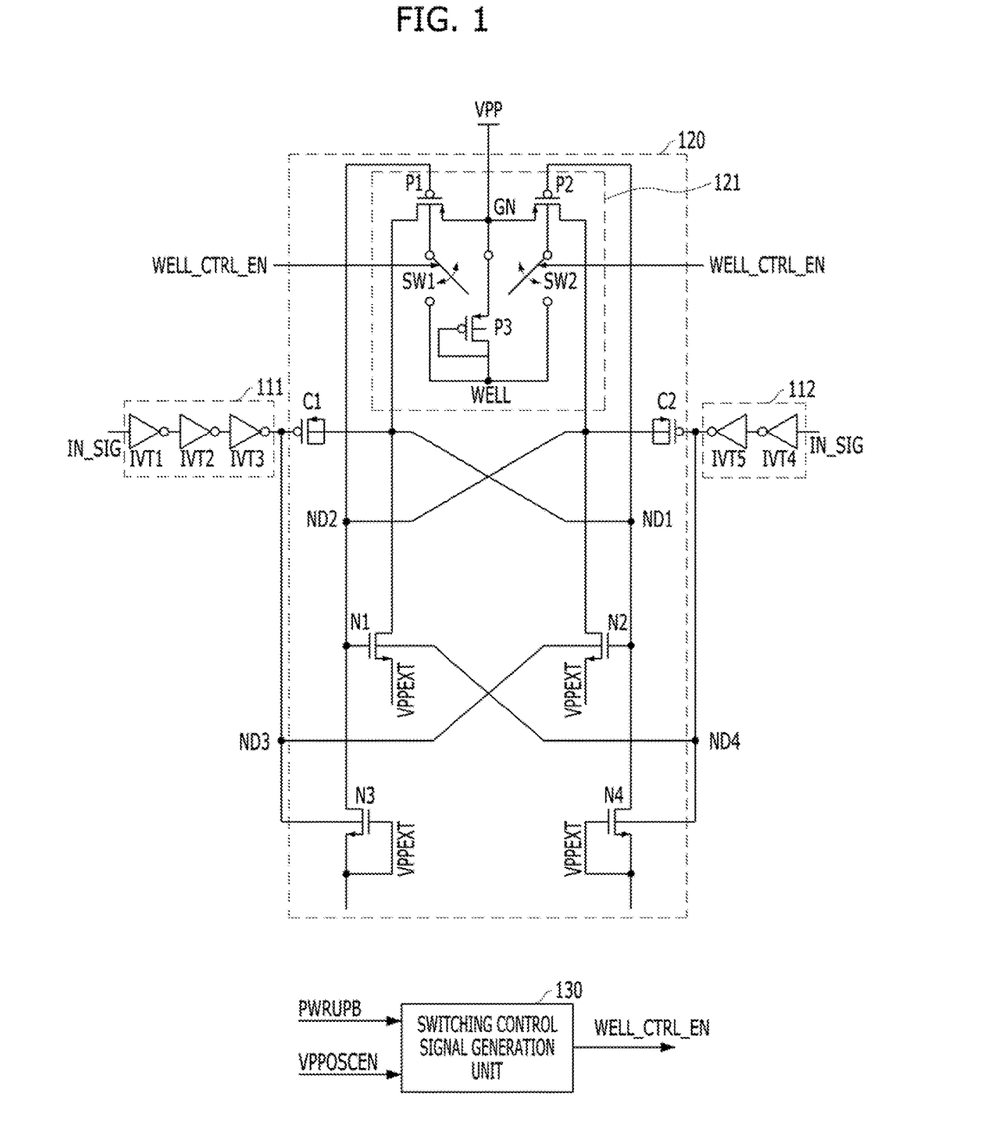
FIG. 1 is a circuit diagram illustrating a charge pump circuit in accordance with an embodiment.

FIG. 1 is a circuit diagram illustrating a charge pump circuit in accordance with an embodiment.

Referring to FIG. 1, the charge pump circuit may include a first input unit 111, a second input unit 112, an internal voltage generation unit 120 and a switching control signal generation unit 130.

The first input unit 111 may include a plurality of inverters IV1, IV2 and IV3, and receive an input pulse signal IN_SIG which periodically toggles between a logic high and a logic low state. The second input unit 112 may include a plurality of inverters IV4 and IV5, and receive the input pulse signal IN_SIG which periodically toggles. The input pulse signal IN_SIG may include an oscillation signal which is inputted while swinging between an external voltage VPPEXT and a ground voltage VSS.

Each of the first and second input units 111 and 112 may include a plurality of inverters. The number of inverters included in the first input unit 111 is different from the number of inverters included in the second input unit 112. Therefore, the input pulse signals IN_SIG inputted to the first and second input units 111 and 112 may be outputted to third and fourth nodes ND3 and ND4, respectively, while being exactly out of phase. That is, the voltage levels of the third and fourth nodes ND3 and ND4 may toggle at the opposite levels.

The external voltage VPPEXT may have an active level which is higher than a main supply voltage VDD. For example, the external voltage VPPEXT may have an active level of 2.5V, which is higher than the main supply voltage VDD having an active level of 1.2V, among the voltages inputted to the semiconductor device.

The internal voltage generation unit 120 may generate an internal voltage VPP by performing a charge pumping operation in response to the external voltage VPPEXT and the input pulse signals IN_SIG which are outputted through the first and second input units 111 and 112 while being exactly out of phase. The internal voltage generation unit 120 may include a transfer transistor unit 121, first and second capacitive elements C1 and C2 and first to fourth NMOS transistors N1 to N4.

The transfer transistor unit 121 may include first to third PMOS transistors P1 to P3 and first and second switches SW1 and SW2.

The first PMOS transistor P1 may be coupled between a generation node GN and a first node ND1, and have a gate terminal coupled to a second node ND2 and a bulk terminal coupled to one end of the first switch SW1. The second PMOS transistor P2 may be coupled between the generation node GN and the second node ND2, and have a gate terminal coupled to the first node ND1 and a bulk terminal coupled to one end of the second switch SW2. The third PMOS transistor P3 may be coupled between the generation node GN and a well bias voltage WELL, and have a gate terminal configured to receive the well bias voltage WELL.

The other ends of the first and second switches SW1 and SW2 may be coupled to the generation node GN or the other terminal of the third PMOS transistor P3 in response to switching control signals WELL_CTRL_EN, respectively, and apply the well bias voltages WELL having different voltage levels to an output node, that is, the generation node GN.

The first capacitive element C1 may be coupled between the first and third nodes ND1 and ND3, and the second capacitive element C2 may be coupled between the second and fourth nodes ND2 and ND4, in order to perform a pumping operation.

The first NMOS transistor N1 may have one terminal coupled to the first node ND1, the other terminal configured to receive the external voltage VPPEXT, a gate terminal coupled to the second node ND2, and a bulk terminal coupled to the fourth node ND4. The second NMOS transistor N2 may have one terminal coupled to the second node ND2, the other terminal configured to receive the external voltage VPPEXT, a gate terminal coupled to the first node ND1, and a bulk terminal coupled to the third node ND3.

The third NMOS transistor N3 may have one terminal coupled to the second node ND2, the other terminal and gate terminal configured to receive the external voltage VPPEXT, and a bulk terminal coupled to the third node ND3. The fourth NMOS transistor N4 may have one terminal coupled to the first node ND1, the other terminal and gate terminal configured to receive the external voltage VPPEXT, and a bulk terminal coupled to the fourth node ND4.

For reference, the first and second capacitive elements C1 and C2 may include capacitors.

The switching control signal generation unit 130 may generate the switching control signal WELL_CTRL_EN for controlling the connection of the first and second switches SW1 and SW2 in the transfer transistor unit 121 in response to a power-up signal PWRUPB and a pumping enable signal VPPOSCEN. The power-up signal PWRUPB may include a pulse signal which retains a high level H as a default value and is deactivated to a low level L when a power-up operation is started. The pumping enable signal VPPOSCEN may include a signal which always retains a high level H during an operation of the charge pump circuit. The switching control signal generation unit 130 may include an SR latch circuit, and output the switching control signal WELL_CTRL_EN at a high level H until the internal voltage VPP reaches the target level from the start time of the power-up operation. Then, the switching control signal generation unit 130 can control the switching control signal WELL_CTRL_EN to retain a low level L.

Hereafter, the operation of the charge pump circuit will be described.

First, the input pulse signals IN_SIG may be inputted to the third and fourth nodes ND3 and ND4 through the first and second input units 111 and 112, respectively, while being exactly out of phase. The first and second nodes ND1 and ND2 may be precharged to the level of the external voltage VPPEXT by the first and second NMOS transistors N1 and N2, respectively.

When a low-level signal (hereafter, L-level signal) is inputted to the third node ND3 and a high-level signal (hereafter, H-level signal) is inputted to the fourth node ND4, the first NMOS transistor N1 may be turned on to precharge the first node ND1. On the other hand, when a H-level signal is inputted to the third node ND3 and a L-level signal is inputted to the fourth node ND4, the first NMOS transistor N1 may be turned off, and the first node ND1 may be pumped to a voltage level which is twice higher than the voltage level of the external voltage VPPEXT. At this time, since the second node ND2 has the level of the external voltage VPPEXT, the first PMOS transistor P1 of the transfer transistor unit 121 may be turned on, and the pumped charge may be transmitted to the generation node GN and outputted as the internal voltage VPP.

The transfer transistor unit 121 may couple the first and second switches SW1 and SW2 to the generation node GN or the other terminal of the third PMOS transistor P3 in response to the switching control signal WELL_CTRL_EN. The activation of the switching control signal WELL_CTRL_EN may be controlled depending on an operation period. First, during the power-up period which is the initial period of the pumping operation, the switching control signal WELL_CTRL_EN may have a H-level. In this case, the first and second switches SW1 and SW2 may be directly coupled to the generation node GN. The switching operation of the charge pump circuit at this time will be described with reference to FIG. 2.

Figure 2:
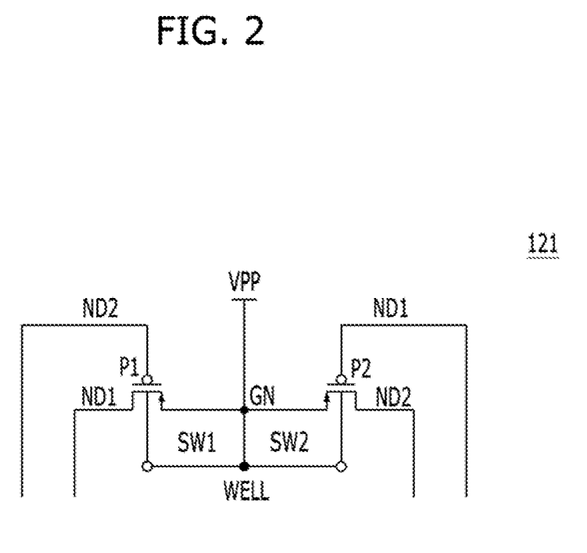
FIG. 2 is a diagram illustrating a switch coupling at a power-up period of a transfer transistor unit illustrated in FIG. 1.

FIG. 2 is a diagram illustrating a switch coupling of the transfer transistor unit 121 illustrated in FIG. 1, during a power-up period.

Referring to FIG. 2, the other ends of the first and second switches SW1 and SW2 may be coupled to the generation node GN in response to the switching control signal WELL_CTRL_EN activated to a H-level, and output the well bias voltage WELL as the internal voltage VPP. That is, the well bias voltage WELL of the first PMOS transistor P1 may be directly coupled to the internal voltage VPP serving as an output node. Therefore, the internal voltage VPP may be outputted at the level of the well bias voltage WELL. Through this configuration, both of a well current and a well channel can be used to perform a pumping operation.

The operation of the transfer transistor unit 121 will be described in more detail with reference to FIGS. 3A and 3B.

Figure 3A:
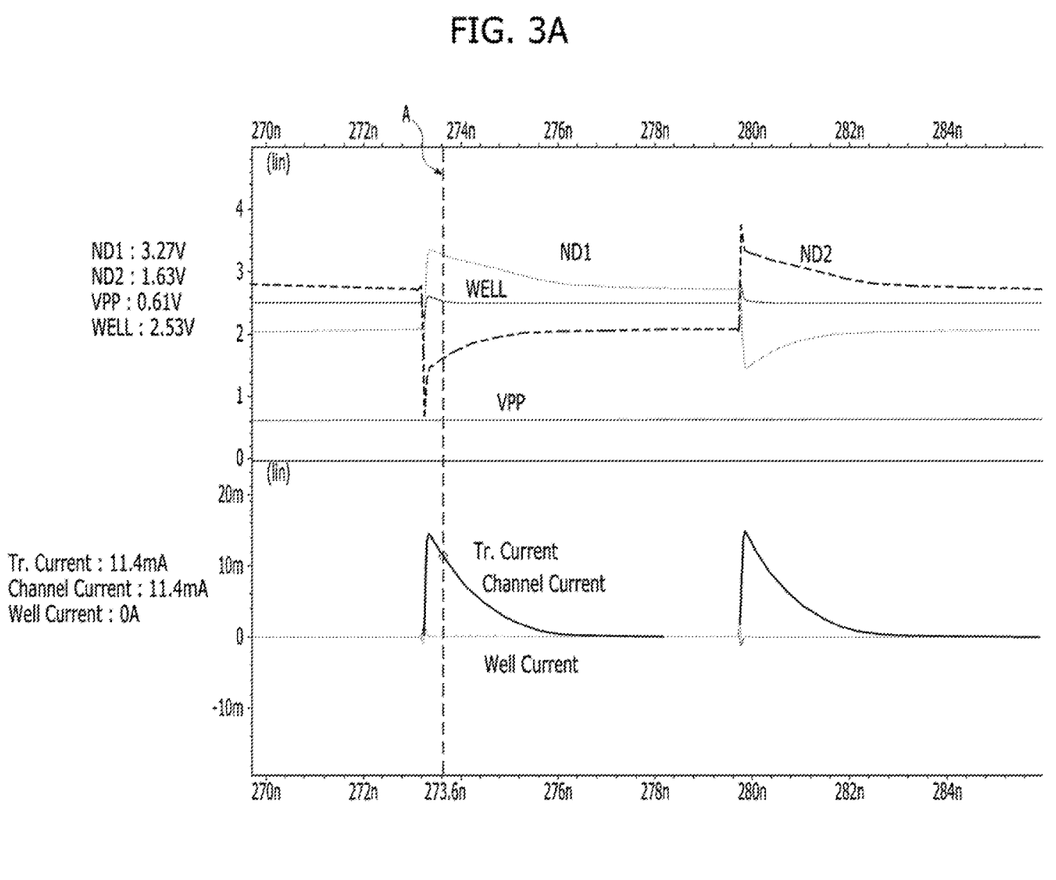
FIG. 3A is a diagram illustrating a simulation result during a power-up period in accordance with a comparative example.
Figure 3B:
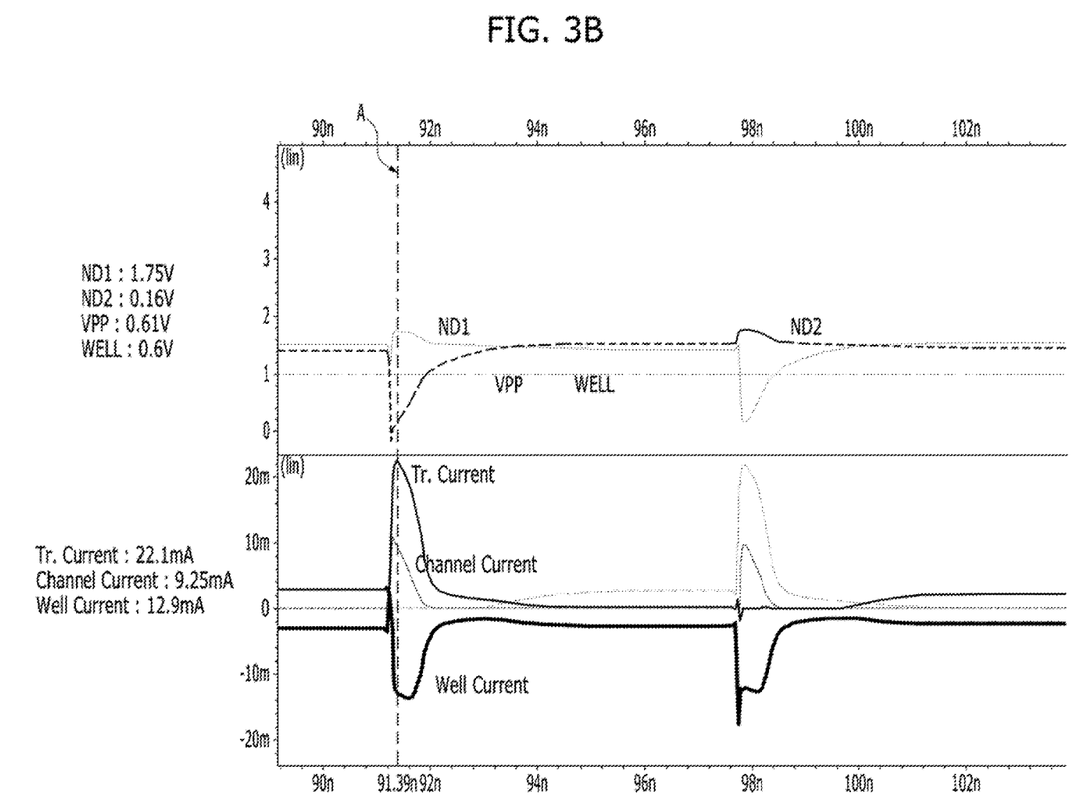
FIG. 3B is a diagram illustrating a simulation result of the transfer transistor unit illustrated in FIG. 2 during the power-up period.

FIG. 3A is a diagram illustrating a simulation result during a power-up period in accordance with a comparative example, and FIG. 3B is a diagram illustrating a simulation result of the transfer transistor unit 121 illustrated in FIG. 2 during the power-up period.

Referring to FIG. 3A, the voltage levels of the respective nodes at a measurement point A may be set as follows. The first node ND1 is 3.27V, the second node ND2 is 1.63V, the output node VPP is 0.61V, and the well node WELL is 2.53V. The general charge pump circuit may apply the well bias voltage of the transfer transistor as an input voltage when the voltage level of the output terminal thereof is lower than the voltage level of the input terminal thereof, or during the power-up period. Therefore, the well bias voltage WELL of the general charge pump circuit may be adjusted to the voltage level (2.5V) of the external voltage VPPEXT serving as an input voltage.

In FIG. 3A, Tr. Current represents the sum of a current flowing to the channel of a transistor and a current flowing to the well of the transistor. That is, although a forward bias is applied to a P/N junction between the first node ND1 and the N-type well, a current flowing to the well is blocked because the forward bias is close to a threshold voltage.

Referring to FIG. 3B, the voltage levels of the respective nodes at the measurement point A may be set as follows. The first node ND1 is 1.75V, the second node ND2 is 0.16V the output node VPP is 0.61V, and the well node WELL is 0.6V. At this time, the first PMOS transistor P1 may be turned on, and the channel current may flow. Furthermore, a forward bias higher than a threshold voltage may be applied to the P/N junction between the N-type well and the first node ND1 coupled to the source of the first PMOS transistor P1. Therefore, the well current may also flow to the N-type well from the first node ND1. At this time, the channel current may be 9.25 mA, and the well current may be 12.9 mA. Therefore, the current flowing to the well may flow to the output terminal, because the well current node and the output terminal, that is, the well bias voltage WELL are coupled to the generation node GN.

Comparing to FIGS. 3A and 3B, the internal voltages VPP serving as the output nodes may have the same voltage level of 0.61 at the power-up period which is the initial period of the pumping operation, and the transistor current Tr. Current of the charge pump circuit in accordance with the comparative example (Tr. Current=Channel Current+Well Current) is 11.4 mA, but the transistor current Tr. Current of the charge pump circuit in accordance with the present embodiment may be 22.1 mA. That is, during the power-up period, the drivability of the charge pump circuit in accordance with the present embodiment may be almost doubled in comparison to the charge pump circuit in accordance with the comparative example. Therefore, the charge pump circuit in accordance with the present embodiment can reduce the power-up time.

Referring back to FIG. 1, when the voltage level of the output terminal or the generation node GN reaches the target level after the power-up period is ended, the other ends of the first and second switches SW1 and SW2 may be coupled to the other terminal of the third PMOS transistor P3 in response to the switching control signal WELL_CTRL_EN deactivated to a L-level. The switching operation of the charge pump circuit at this time will be described with reference to FIG. 4.

Figure 4:
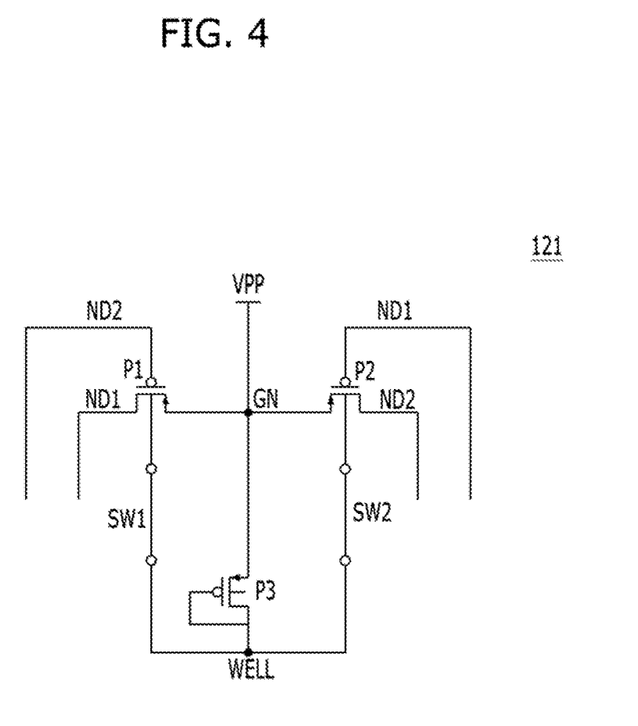
FIG. 4 is a diagram illustrating a switch coupling at a period in which an internal voltage of the transfer transistor unit illustrated in FIG. 1 reaches a target level.

FIG. 4 is a diagram illustrating a switch coupling at a period in which the internal voltage VPP of the transfer transistor unit 121 illustrated in FIG. 1 reaches the target level.

Referring to FIG. 4, the other ends of the first and second switches SW1 and SW2 may be coupled to the other terminal of the third PMOS transistor P3 in response to the switching control signal WELL_CTRL_EN deactivated to a L-level, and the well bias voltage WELL having a voltage level (VPP-Vth) may be outputted. The voltage level (VPP-Vth) may be obtained by subtracting the threshold voltage Vth from the internal voltage VPP. Therefore, the threshold voltage Vth of the first PMOS transistor P1 may decrease, while the current rises.

The operation of the transfer transistor unit 121 will be described in more detail with reference to FIGS. 5A and 5B.

Figure 5A:
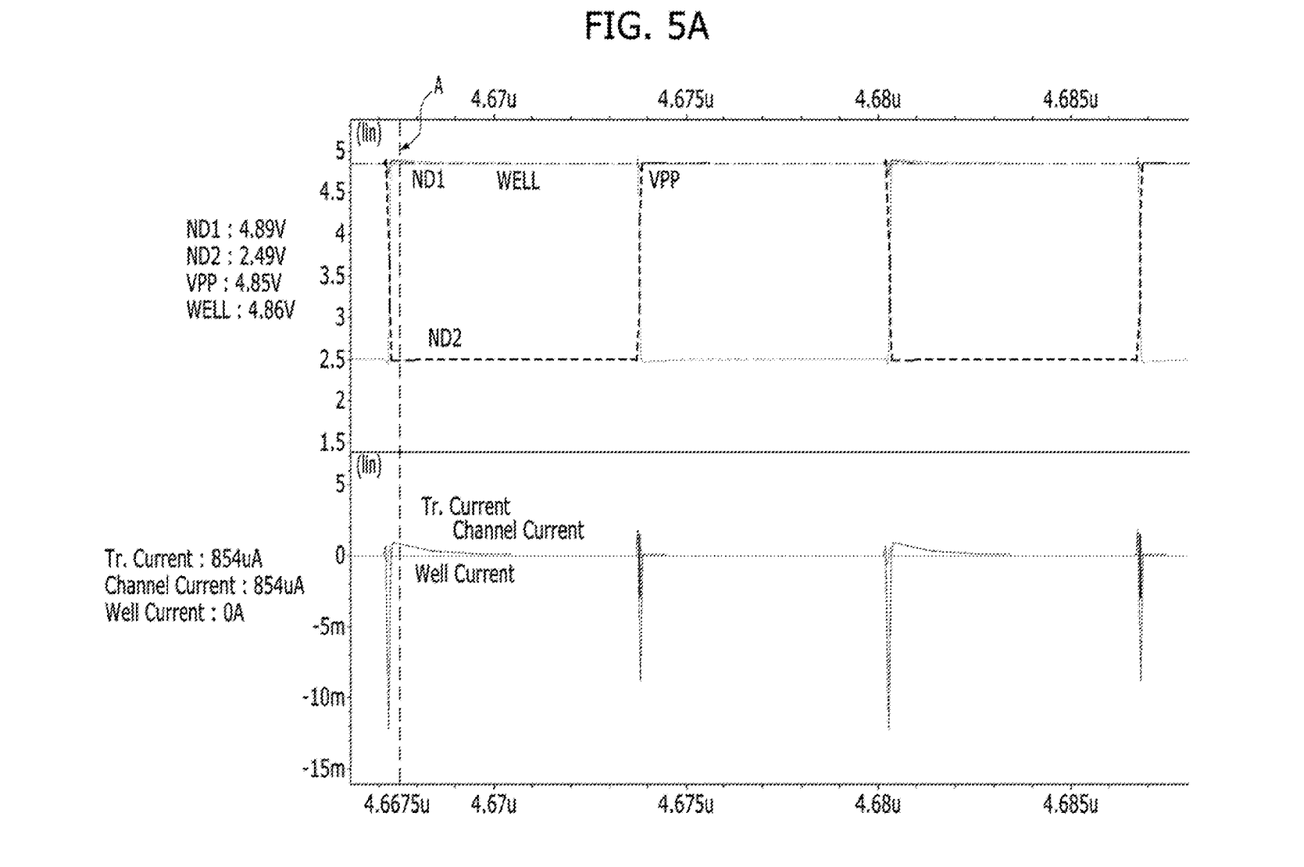
FIG. 5A is a diagram illustrating a simulation result of a period in which the internal voltage reaches the target level after a power-up operation in accordance with a comparative example.
Figure 5B:
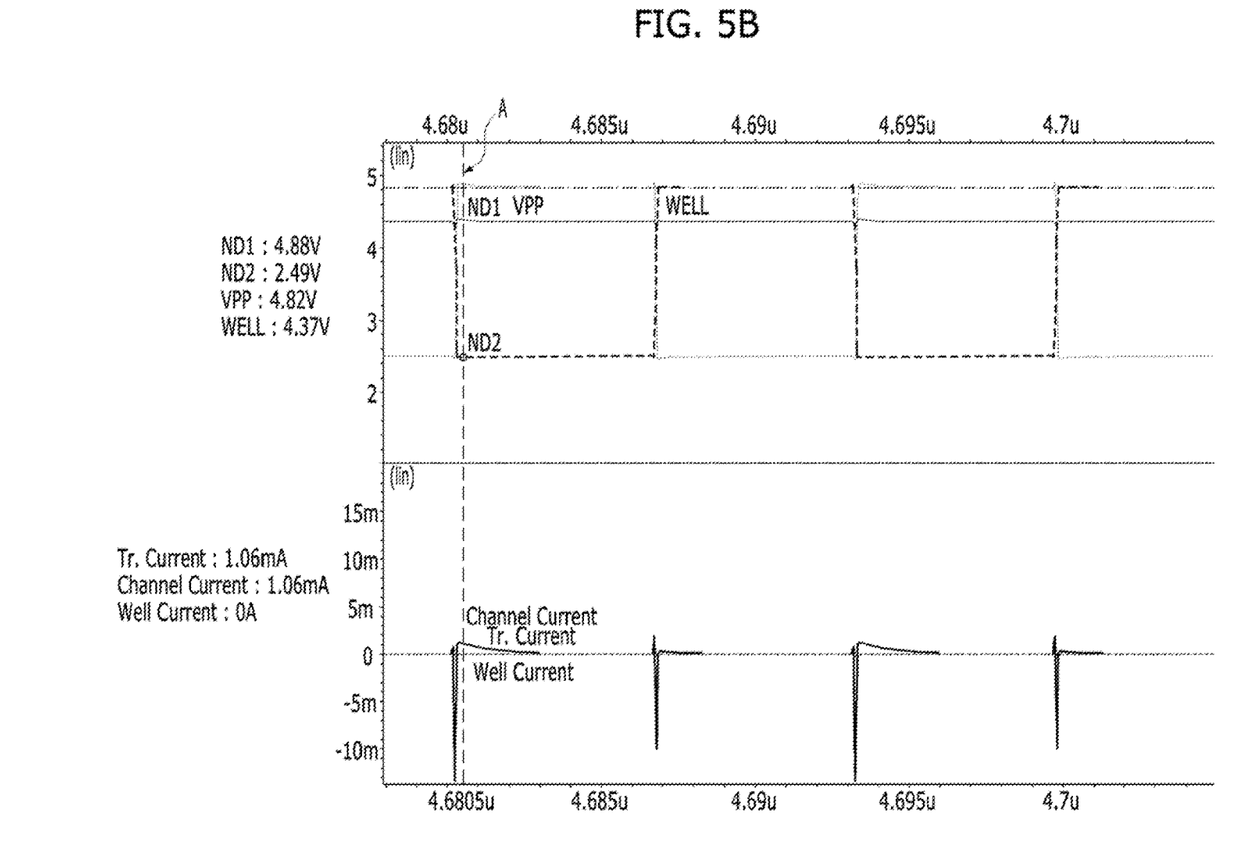
FIG. 5B is a diagram illustrating a simulation result of the transfer transistor unit 121 illustrated in FIG. 4, during a period in which the internal voltage reaches the target level after the power-up period.

FIG. 5A is a diagram illustrating a simulation result of a period (i.e., a normal operation period) in which the internal voltage VPP reaches the target level after the power-up period in accordance with the comparative example, and FIG. 5B is a diagram illustrating a simulation result of the transfer transistor unit 121 illustrated in FIG. 4, during a period (i.e., a normal operation period) in which the internal voltage VPP reaches the target level after the power-up operation.

Referring to FIG. 5A, the voltage levels of the respective nodes at a measurement point A may be set as follows. The first node ND1 is 4.89V, the second node ND2 is 2.49V, the output node VPP is 4.85V, and the well node WELL is 4.86V. The charge pump circuit in accordance with the comparative example may apply the well-bias voltage as an output voltage when the voltage level of the output terminal becomes higher than the voltage level of the input terminal, that is, at a period in which the voltage level reaches the target level after the power-up period. Since the first node ND1 and the N-type well have no potential difference therebetween, no current may flow to the well, and only the channel current may flow. At, this time, the channel current may be 854 uA.

Referring to FIG. 5B, the voltage levels of the respective nodes at the measurement point A may be set as follows. The first node ND1 is 4.88V, the second node ND2 is 2.49V, the output node VPP is 4.82V and the well node WELL is 4.37V. The transfer transistor unit 121 in accordance with the present embodiment may apply the well bias voltage WELL as a voltage level obtained by subtracting the threshold voltage Vth from the internal voltage VPP, at the period in which the internal voltage VPP serving as the output node reached the target level. That is, although a forward bias is applied to the P/N junction between the first node ND1 and the N-type well, the well current may not flow because the forward bias is smaller than the threshold voltage. That is, the well current does not flow, but only the channel current may flow. At this time, the well current may be 1.06 mA.

Comparing FIGS. 5A and 5B, when the voltage level of the internal voltage VPP serving as the output voltage reached the target level (VPP=4.85V, VPP=4.82V), the transistor current Tr. Current of the transfer transistor in the charge pump circuit in accordance with the comparative example is 854 uA, but the transistor current Tr. Current of the transfer transistor unit in the charge pump circuit in accordance with the present embodiment is 1.06 mA. That is, the drivability can be improved by approximately 24% during a normal operation corresponding to a point of time that the voltage level of the internal voltage VPP reached the target level after the power-up operation.

In short the charge pump circuit in accordance with the present embodiment can maximize the transistor current of the transfer transistor at each operation period by applying the well bias voltage at different voltage levels depending on the pumping operation period, thereby improving the drivability.

The charge pump circuit can be operated through a method including: receiving an input pulse signal; generating a switching control signal in response to a power-up signal and a pumping enable signal; and generating an internal voltage by performing a pumping operation in response to the input pulse signal and an external voltage. The internal voltage is applied as a well bias voltage in response to the switching control signal during a power-up operation, and a voltage obtained by subtracting a threshold voltage from the internal voltage is applied as the well bias voltage during a normal operation after the power-up operation.

Figure 6:
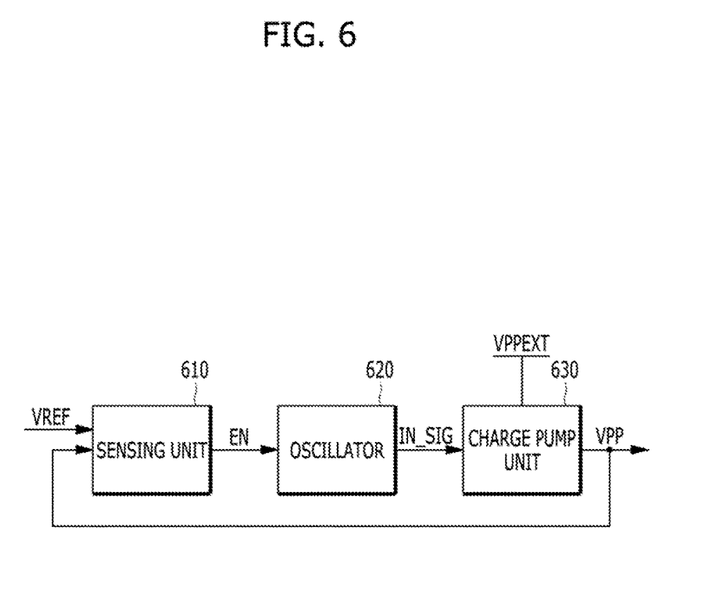
FIG. 6 is a configuration diagram of a voltage generating device in accordance with an embodiment.

FIG. 6 is a configuration diagram of a voltage generating device in accordance with an embodiment.

Referring to FIG. 6, the voltage generating device may include a sensing unit 610, an oscillator 620 and a charge pump unit 630.

The sensing unit 610 may compare a reference voltage VREF and an internal voltage VPP, and output a sensing signal EN based on the comparison result. The sensing unit 610 may output the sensing signal EN at an H-level (high level) when the internal voltage VPP has a lower voltage, level than the reference voltage VREF, and output the sensing signal EN at an L-level (low level) when the internal voltage VPP has a higher level than the reference voltage VREF.

The oscillator 620 may output an input pulse signal IN_SIG which periodically swings in response to the sensing signal EN. The oscillator 620 may output the input pulse signal IN_SIG when the enabled sensing signal EN is inputted.

The charge pump unit 630 may generate the internal voltage VPP by performing a pumping operation in response to the input pulse signal IN_SIG and an applied external voltage VPPEXT. Since the charge pump unit 630 is configured and operated in the same manner as the charge pump circuit illustrated in FIG. 1, the detailed descriptions thereof are omitted herein.

Although not illustrated, the charge pump unit 630 may differently set a well bias voltage at a power-up operation period and a normal operation period after the power-up operation period, in response to a switching control signal, and apply the well bas voltage as the internal voltage VPP. Setting the well bias voltage differently depending on the operation periods and applying it as the internal voltage VPP may maximize the transfer transistor current at each of the operation periods.

More specifically, the charge pump unit 630 may include a transfer transistor for transmitting a pumped charge to the output terminal, for example, the transfer transistor unit 121 illustrated in FIG. 1. The present invention allows raising the efficiency of the pump by the transfer transistor passing a maximum amount of current within one oscillation cycle of the charge pump, thereby raising the drivability. This is particularly advantageous, in recently developed charge pump units wherein the oscillation cycle of the charge pump circuit has been decreased substantially. That is, during the power-up period, the internal voltage VPP may be applied as the well bias voltage. Further, during a period in which the internal voltage VPP reaches the target level after the power-up period, a voltage obtained by subtracting the threshold voltage of the transfer transistor from the internal voltage VPP may be applied as the well bias voltage, thereby increasing the current to improve the drivability.

In accordance with the present embodiment, the charge pump circuit can adjust the well bias voltage of the transfer transistor to the optimal value depending on the operation period, thereby increasing the drivability.

Although various embodiments have been described for illustrative purposes, it will be apparent to those skilled in the art that various changes and modifications may be made without departing from the spirit and scope of the invention as defined in the following claims.

What is claimed is:
1. A charge pump circuit comprising:
input units suitable for receiving a first input pulse signals and outputting second input pulse signals that are out of phase;
an internal voltage generation unit suitable for generating an internal voltage by performing a voltage pumping operation in response to an external voltage and the second input pulse signals, and adjusting a well bias voltage at a power-up period and a normal operation period after the power-up period, in response to a switching control signal; and
a switching control signal generation unit suitable for generating the switching control signal which is activated differently on the power-up period and the normal operation period.

2. The charge pump circuit of claim 1, wherein the switching control signal generation unit generates the switching control signal in response to a power-up signal and a pumping enable signal.

3. The charge pump circuit of claim 1, wherein the internal voltage generation unit comprises a transfer transistor unit suitable for applying the internal voltage as the well bias voltage or applying a voltage obtained by subtracting a threshold voltage from the internal voltage as the well bias voltage, in response to the switching control signal.

4. The charge pump circuit of claim 3, wherein during the power-up period, the transfer transistor unit applies the internal voltage as the well bias voltage in response to the switching control signal activated to a high level.

5. The charge pump, circuit of claim 3, wherein during the normal operation period, the transfer transistor unit applies the voltage obtained by subtracting the threshold voltage from the internal voltage as the well bias voltage, in response to the switching control signal deactivated to a low level.

6. The charge pump circuit of claim 1, wherein the transfer transistor unit comprises:
a first PMOS transistor coupled between a generation node and a first node, the first PMOS transistor having a gate terminal coupled to a second node and a bulk terminal configured to receive the well bias voltage;
a second PMOS transistor coupled between the generation node and the second node, the second PMOS transistor having a gate terminal coupled to the first node and a bulk terminal configured to receive the well bias voltage;
a third PMOS transistor coupled between the generation node and the well bias voltage node, the third PMOS transistor having a gate terminal configured to receive the well bias voltage;
a first switch having a first end coupled to the bulk terminal of the first PMOS transistor and a second end coupled to the generation node or a drain terminal of the third PMOS transistor in response to the switching control signal; and
a second switch having a first end coupled to the bulk terminal of the second PMOS transistor and a second end coupled to the generation node or the drain terminal of the third PMOS transistor in response to the switching control signal.

7. The charge pump circuit of claim 1, wherein during the power-up operation period the external voltage has a higher voltage level than the internal voltage.

8. The charge pump circuit of claim 1, wherein during the normal operation period the internal voltage reaches a target level higher than the external voltage after the power-up period.

9. The charge pump circuit of claim 6, wherein the internal voltage generation unit comprises:
a first capacitive element coupled between the first node and a third node;
a second capacitive element coupled between the second node and a fourth node;
a first NMOS transistor having a first terminal coupled to the first node, a second terminal configured to receive the external voltage, a gate terminal coupled to the second node, and a bulk terminal coupled to the fourth node;
a second NMOS transistor having a first terminal coupled to the second node, a second terminal configured to receive the external voltage, a gate terminal coupled to the first node, and a bulk terminal coupled to the third node;
a third NMOS transistor having a first terminal coupled to the second node, a second terminal and a gate terminal configured to receive the external voltage, and a bulk terminal coupled to the third node; and
a fourth NMOS transistor having a first terminal coupled to the first node, a second terminal and a gate terminal configured to receive the external voltage, and a bulk terminal coupled to the fourth node.

10. The charge pump circuit of claim 9, wherein each of the first and second capacitive elements comprises a capacitor.

11. The charge pump circuit of claim 9, wherein the first and second NMOS transistors precharge the first and second nodes to the external voltage in response to the signal levels of the third and fourth nodes.

12. The charge pump circuit of claim 1, wherein the external voltage comprises a high voltage having a higher voltage level than a main supply voltage VDD.

13. An operation method of a charge pump circuit, comprising:
receiving an input pulse signal;
generating a switching control signal; and
generating an internal voltage by performing a pumping operation in response to the input pulse signal and an external voltage, wherein the internal voltage is applied as a well bias voltage during a power-up operation, and a voltage obtained by subtracting a threshold voltage from the internal voltage is applied as the well bias voltage during a normal operation after the power-up operation, in response to the switching control signal.

14. The operating method of claim 13, wherein the generating of the switching control signal comprises:
generating the switching control signal at a high level during the power-up operation in response to a power-up signal and a pumping enable signal; and
generating the switching control signal at a low level during the normal operation after the power-up operation in response to the power-up signal and the pumping enable signal.

15. The operating method of claim 13, wherein the power-up operation period is where the external voltage has a higher voltage level than the internal voltage.

16. The operating method of claim 13, wherein the normal operation period is where the internal voltage reaches a target level higher than the external voltage, after the power-up period.

17. A voltage generating device comprising:
a sensing unit suitable for generating a sensing signal based on a reference voltage and an internal voltage;
an oscillator suitable for generating a first input pulse signal in response to the sensing signal; and
a charge pump unit suitable for generating an internal voltage by performing a pumping operation in response to the input pump signal and an external voltage and applying the internal voltage as a well bias voltage during a power-up period or applying a voltage obtained by subtracting a threshold voltage from the internal voltage as the well bias voltage during a normal operation period after the power-up period.

18. The voltage generating device of claim 17, wherein the charge pump unit comprises:
input units suitable for receiving the first input pulse signal and outputting second input pulse signals that are out of phases each other;

an internal voltage generation unit suitable for generating the internal voltage by performing a voltage pumping operation in response to an external voltage and the second input pulse signals, and adjusting the well bias voltage at the power-up period and the normal operation period, in response to a switching control signal; and a switching control signal generation unit suitable for generating the switching control signal of which activation is differently controlled depending on the power-up period and the normal operation period.

19. The voltage generating device of claim 18, wherein the internal voltage generation unit comprises a transfer transistor unit suitable for applying the internal voltage as the well bias voltage or applying the voltage obtained by subtracting the threshold voltage from the internal voltage as the well bias voltage, in response to the switching control signal.

20. The voltage generating device of claim 17, wherein during the normal operation period the internal voltage reaches a target level after the power-up period.

* * * * *